(12) United States Patent
Tan et al.

(10) Patent No.: US 9,476,910 B2
(45) Date of Patent: Oct. 25, 2016

(54) TEST SOCKET WITH HOOK-LIKE PIN CONTACT EDGE

(71) Applicant: Test Max Manufacturing Pte Ltd, Singapore (SG)

(72) Inventors: Hui Li Natali Tan, Singapore (SG); Hui Shan Melisa Tan, Singapore (SG)

(73) Assignee: Test Max Manufacturing Pte Ltd, Singapore (SG)

( * ) Notice: Subject to any disclaimer, the term of this patent is extended or adjusted under 35 U.S.C. 154(b) by 75 days.

(21) Appl. No.: 14/380,067

(22) PCT Filed: Nov. 19, 2012

(86) PCT No.: PCT/SG2012/000431
§ 371 (c)(1),
(2) Date: Aug. 20, 2014

(87) PCT Pub. No.: WO2013/126016
PCT Pub. Date: Aug. 29, 2013

(65) Prior Publication Data
US 2015/0015294 A1 Jan. 15, 2015

(30) Foreign Application Priority Data
Feb. 21, 2012 (SG) .................................. 201201201

(51) Int. Cl.
*G01R 1/04* (2006.01)
*G01R 1/073* (2006.01)
*G01R 1/067* (2006.01)

(52) U.S. Cl.
CPC ......... *G01R 1/0466* (2013.01); *G01R 1/06716* (2013.01); *G01R 1/07357* (2013.01); *G01R 1/06733* (2013.01)

(58) Field of Classification Search
CPC ............ G01R 1/0466; G01R 1/07357; G01R 1/06716
USPC ...................................................... 324/756.02
See application file for complete search history.

(56) References Cited

U.S. PATENT DOCUMENTS 5,788,526 A * 8/1998 Twigg ...................... G01R 1/04
439/331
6,293,814 B1 9/2001 Tan
(Continued)

FOREIGN PATENT DOCUMENTS

DE 102007058365 A1 6/2009

OTHER PUBLICATIONS

International Search Report of international patent application No. PCT/SG2012/000431 completed on Mar. 15, 2013 and mailed on Mar. 25, 2013.
(Continued)

*Primary Examiner* — Thomas F Valone
(74) *Attorney, Agent, or Firm* — Pyprus Pte Ltd

(57) ABSTRACT

The present invention provides a test socket adaptable for testing different Integrated Circuit (IC) pad size during an IC testing. The test socket comprising a molded socket having an inner space and a plurality of through-apertures disposed on its surface; and a plurality of contact elements disposed within the inner space of the molded socket, each contact element has a pin contact edge and a pin-end; wherein each pin contact edge extends through the through-apertures of the molded socket; wherein each pin contact edge provides a linear surface area for contact with the DUT's lead; and wherein each pin contact edge provides a large contact area for various DUT's lead size.

9 Claims, 9 Drawing Sheets

(56) References Cited

U.S. PATENT DOCUMENTS

| | | | |
|---|---|---|---|
| 6,369,596 B1* | 4/2002 | Anderson | G01R 1/0483 324/750.25 |
| 7,256,598 B2 | 8/2007 | Leong | |
| 2005/0059173 A1 | 3/2005 | Chuan et al. | |
| 2005/0130504 A1 | 6/2005 | Kraemer | |
| 2005/0162152 A1 | 7/2005 | Yates | |

OTHER PUBLICATIONS

Written Opinion of international patent application No. PCT/SG2012/000431 completed on Mar. 15, 2013 and mailed on Mar. 25, 2013.

International Preliminary Report on Patentability of international patent application No. PCT/SG2012/000431 mailed on Jun. 4, 2014.

* cited by examiner

TEST SOCKET WITH HOOK-LIKE PIN CONTACT EDGE

FIELD OF THE INVENTION

The present invention relates to a test socket. In particular, the test socket is adapted for testing different Integrated Circuit (IC) pad size, in which a hook-like pin contact edge provides a larger contact area for various IC pad sizes.

BACKGROUND

Semiconductor Automatic Test Equipment (ATE) is widely used in the manufacturing industry to test the various types of semiconductor devices. Some examples are Integrated Circuit (IC) devices, printed circuit boards (PCBs), etc. A Device Under Test (DUT) is a term commonly used to refer to any device undergoing any testing. The DUT is usually inserted into a test socket that is connected to the ATE in semiconductor testing. There are a variety of test sockets available in the market today, such as Kelvin test sockets, multi-nest sockets and etc. As semiconductor devices continues to shrink in sizes and improving in its performance, manufacturing and testing these devices has become increasingly difficult.

A test socket provided with Kelvin contacts allows four-terminal measurements. Current test sockets with Kelvin contacts have tips that are angled to one side that is chamfered from a wire in order to test an IC small pad area. However, such Kelvin contacts have a small contact area with the DUT that affects the conductivity. The Kelvin contacts with tips angled to one side will also eventually wear off over continuous usage of the test sockets.

FIG. 1 is an exemplary illustration of a conventional contact tip 101 of a contact element 102 provided for a test socket 100. A wire is used to form the contact element 102 and its contact tip 101 is chamfered to a symmetrical sloping edge. The contact tip 101 is provided for testing of integrated circuit small pad area. However, the contact tip 101 with the symmetrical sloping edge is more susceptible to wearing off. As such, the contact tip 101 needs to be sharpened constantly to remain contactable with the integrated circuit small pad area. Additionally, the contact tip 101 of the contact element 102 has a small contact area. Further, the wire used to form the contact element 102 is made from different materials, width, or thickness to increase the contact element's overall spring force or hardiness.

US Patent document published as "U.S. Pat. No. 6,293,814" illustrates a cross-sectional view of a test socket 200 with Kelvin contact as shown in FIG. 2. The test socket 200 includes a pair of metallic electrodes with a flat contact edge tip 201 embedded in a non-conducting base 202. Each pair of metallic electrodes comprises a first metallic electrode 203 and a second metallic electrode 204. The first metallic electrode 203 and the second metallic electrode 204 are both embedded in the base. The pair of metallic electrodes is arranged mirroring each other in the non-conducting base 202. The first metallic electrode 203 is for contact with a lead of an Integrated Circuit (IC) device 205. Each electrode is electrically insulated from each other. During the testing of the IC device 205, a slight pressure when the IC device 205 is placed onto the test socket, presses the first metallic electrode 203 downwards to come into effective contact is contactable with the second metallic electrode 204.

US patent document published as "U.S. Pat. No. 7,256,598" discloses a hybrid non-abrasive electrical test contact element 301 of another test socket 300 as shown in FIG. 3. The contact element 301 is able to contact a lead of an integrated circuit device under test without abrading the plating on the lead. The contact element 301 possesses multiple loops to allow the tip of the contact element 301 to move not only downwards, but also sideways in a rocking and non-sliding motion.

SUMMARY

In one aspect of the present invention, there is provided a test socket adaptable for testing different Integrated Circuit (IC) pad size during an IC testing. The test socket comprising a molded socket having an inner space and a plurality of through-apertures disposed on its surface; and a plurality of contact elements disposed within the inner space of the molded socket, each contact element has a pin contact edge and a pin-end; wherein each pin contact edge extends through the through-apertures of the molded socket; wherein each pin contact edge provides a linear surface area for contact with the DUT's lead; and wherein each pin contact edge provides a large contact area for various DUT's lead size.

In another embodiment, the contact elements are aligned together in pairs in consecutive rows, each pair positioned to contact a corresponding DUT's lead. Further, each pairs of the contact elements are in a mirror image configuration.

In another embodiment, the pin contact edge is alike a sharp arrow angled at least 45° diagonally upwards.

In yet another embodiment, the contact elements may be customized accordingly to a variety of needs such as widening the diameter of the contact element, different pin contact edge shape, etc.

In yet another aspect of the present invention, the test socket further comprises a floating nest that is supported by a plurality of springs on the surface of the molded socket. The floating nest supports the DUT during testing. The floating nest further includes a number of stand-off pins on its surface.

In yet another aspect of the present invention, the test socket further comprises a socket cap with an opening in the center of the socket cap. The socket cap further includes a plurality of ball bearings partially embedded in one side of the opening.

BRIEF DESCRIPTION OF THE DRAWINGS

This invention will be described by way of non-limiting embodiments of the present invention, with reference to the accompanying drawings, in which.

DETAILED DESCRIPTION

Figure 1:
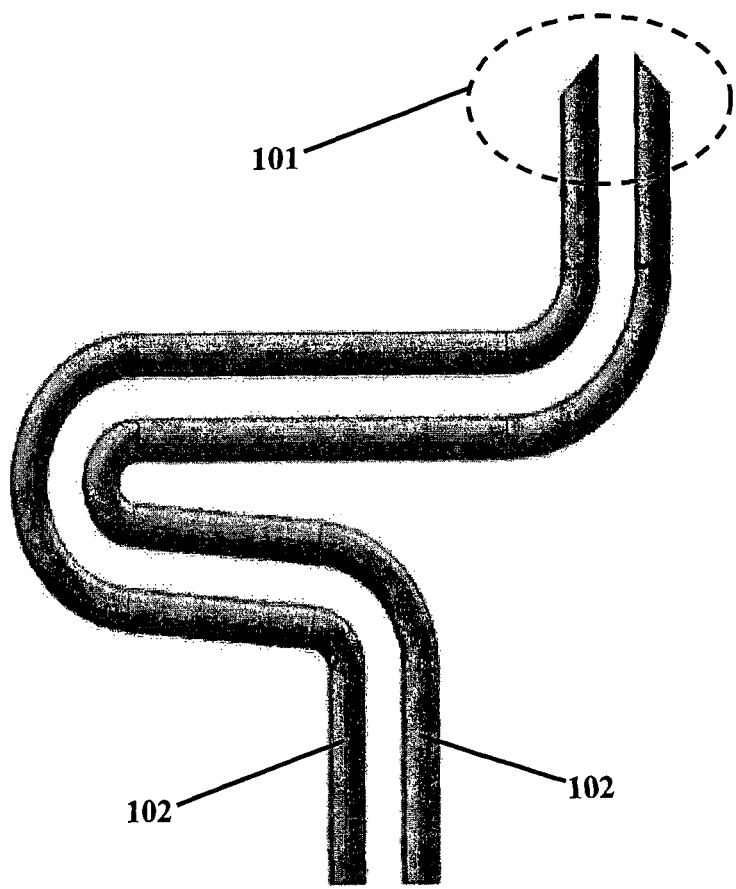
FIG. 1 illustrates a conventional contact tip of a known contact element for a test socket.

The following descriptions of a number of specific and alternative embodiments are provided to understand the inventive features of the present invention. It shall be apparent to one skilled in the art, however that this invention may be practiced without such specific details. Some of the details may not be described in length so as to not obscure the invention. For ease of reference, common reference numerals will be used throughout the figures when referring to same or similar features common to the figures.

Figure 4A:
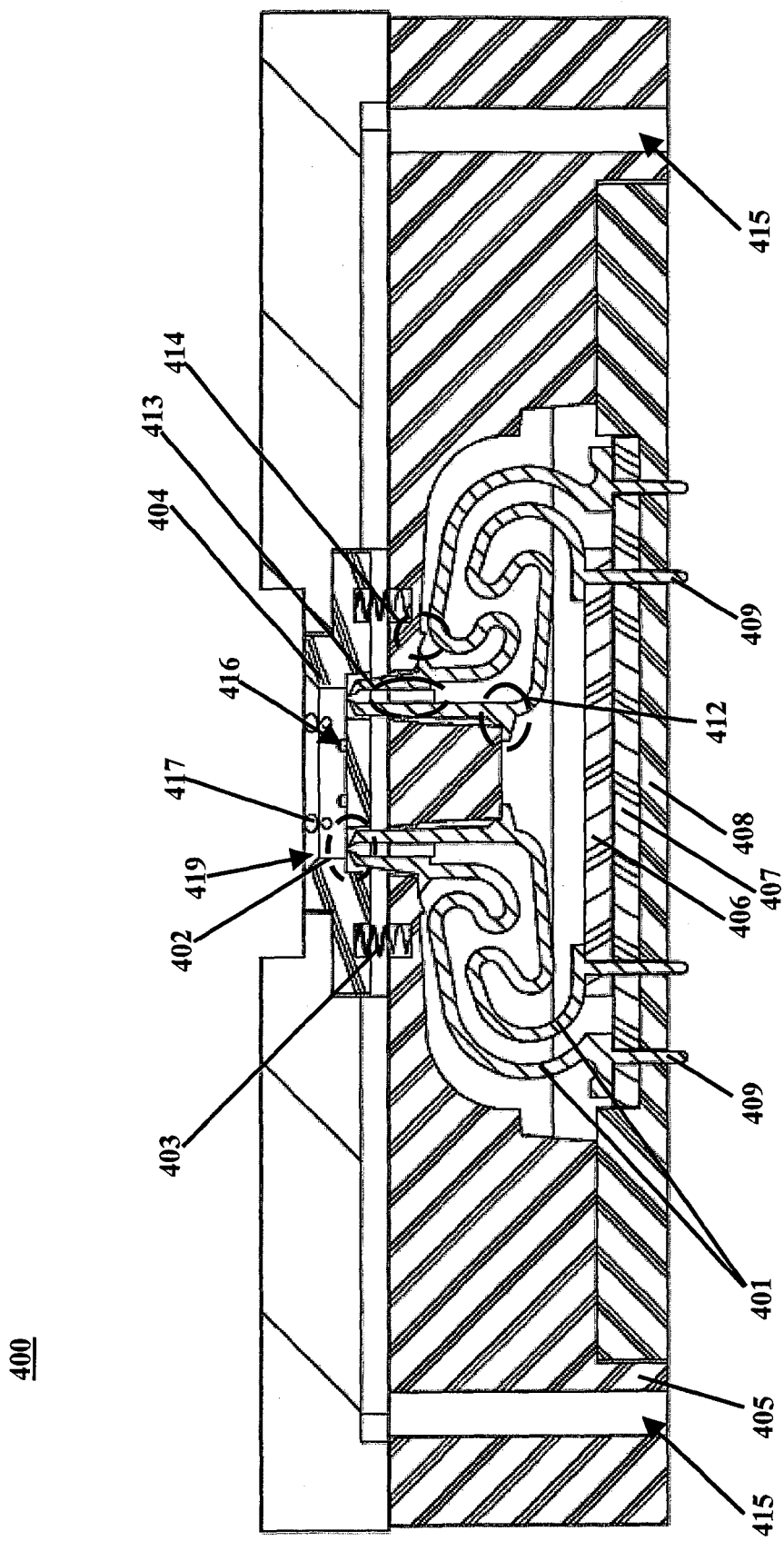
FIG. 4A illustrates a cross-sectional view of a test socket provided with a plurality of contact elements as one embodiment of the present invention.

FIG. 4A shows a cross-sectional view of a test socket 400 having a plurality of contact elements 401 as one embodiment of the present invention. The test socket 400 is adapted for testing different Integrated Circuit (IC) pad size. The test socket 400 comprises a socket cap 418; the plurality of contact elements 401; a plurality of springs 403; a floating nest 404, a molded socket 405; a pin slot 406; a pin base 407; a non-conducting base 408; and a number of air vents 415.

The socket cap 418 has an opening 419 located in the center of the socket cap 418. The socket cap 418 is capped above the molded socket 405 with the opening 419 in the center provided for the floating nest 404. The socket cap 418 further includes a number of ball bearings 417 that is partially embedded within one side of the opening 419, with a portion of the ball bearings 417 exposed on one side of the floating nest 404.

The molded socket 405 has an inner space and a plurality of through-apertures 413 disposed on its surface. The contact elements 401 are disposed within the inner space of the molded socket 405.

The surface of the floating nest 404 further includes a number of stand-off pins 416. The floating nest 404 fits within the opening 419 of the socket cap 418, and is placed above the molded socket 405 with the plurality of springs 403 there between. The pin base 407 is sandwiched between the pin slot 406 and the non-conducting base 408.

Each of the contact elements 401 has a pin-end 409 that is embedded within the pin slot 406, the pin base 407 and the non-conducting base 408. The contact elements 401 are aligned together in pairs in consecutive rows. Each row has two pairs of contact elements 401 that are in a mirror image configuration with each other.

Each contact element 401 also has a pin contact edge 402 similar to a "hook-like" design that is designed to carter various integrated circuit (IC) pad sizes. Examples include an IC pitch of 0.5 mm, etc. The pin contact edge 402 extends through the through-apertures 413 of the molded socket 405. The pin contact edge 402 is alike a sharp arrow angled at least 45° diagonally upwards. In each pair of contact element 401, the contact element 401 is also placed in a mirror image configuration. The pair of contact elements 401 when placed together is similar to a clamping device, typically for holding or securing objects tightly together. The pin contact edge 402 provides a linear surface area for contact with a Device Under Test (DUT) lead. The DUT, also known as a unit under test, is commonly used to refer to a manufactured product undergoing testing.

The "hook-like" design of the pin contact edge 402, as compared to the contact tip 101 of the contact element 102 as shown in FIG. 1, has a bigger contact area. The bigger contact area allows steady flow of current to transport more electrical charges from the pin contact edge 402 to the DUT, therefore improving conductivity. Further, the bigger contact area of the pin contact edge 402 takes a longer time for erosive wear to occur.

Figure 2:
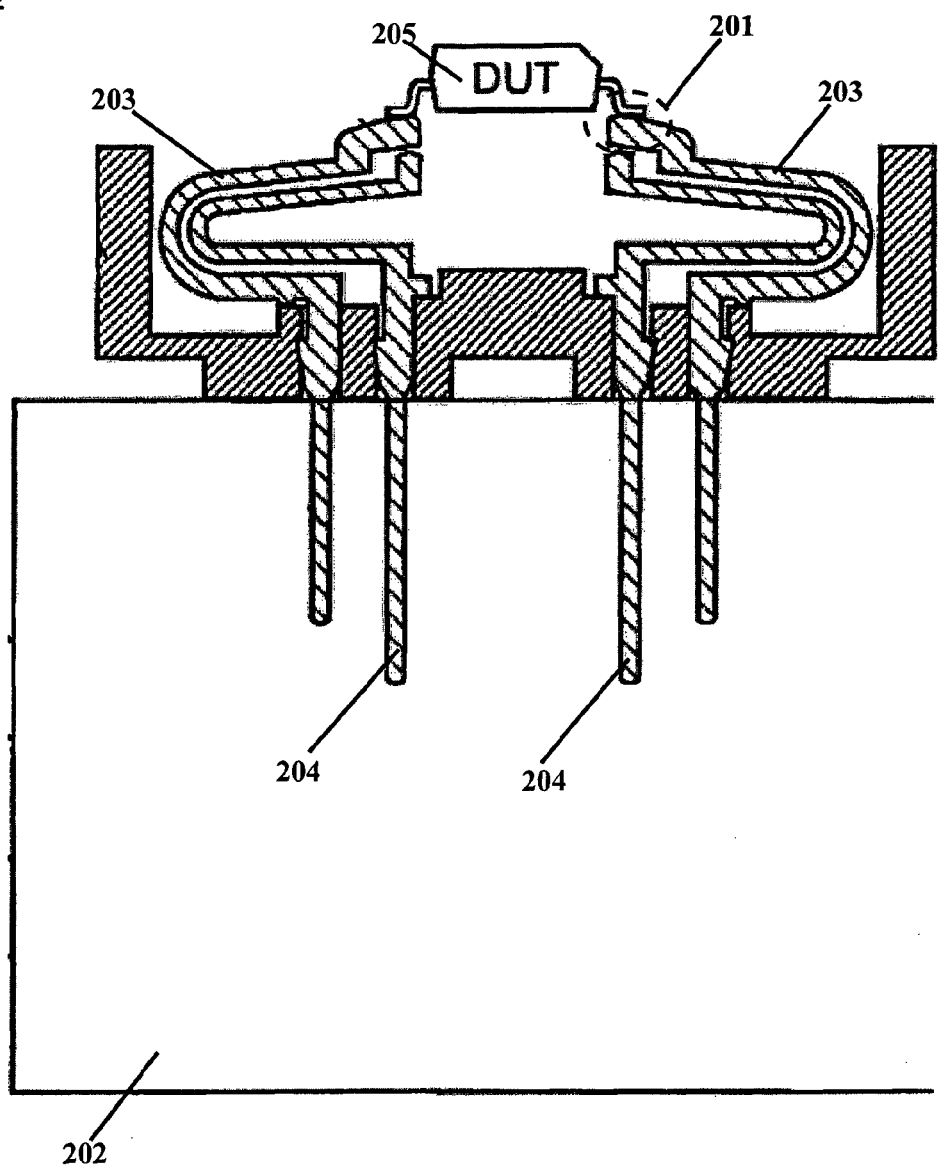
FIG. 2 illustrates a cross-sectional view of a known test socket with Kelvin contact.

Additionally, both pairs of contact elements 401 as shown in FIG. 4A remains in contact with each of the DUT's leads. However, only the first metallic electrode 203 in each pair of the metallic electrodes of the test socket 200 as shown in FIG. 2, remains in contact with the IC device 205. As both pairs of contact elements 401 are in contact with the DUT, this also improves the conductivity during IC testing as compared to the test socket 200 in FIG. 2.

The "hook-like" design of the pin contact edge 402 and the contact element 401 is cut from a wire using Wire Electrical Discharge Machining (EDM), etching, laser cutting etc. It is desired to cut the contact element 401 using the Wire EDM. Wire EDM uses a metal wire to cut out a desired shape of the contact element 401.

Figure 3:
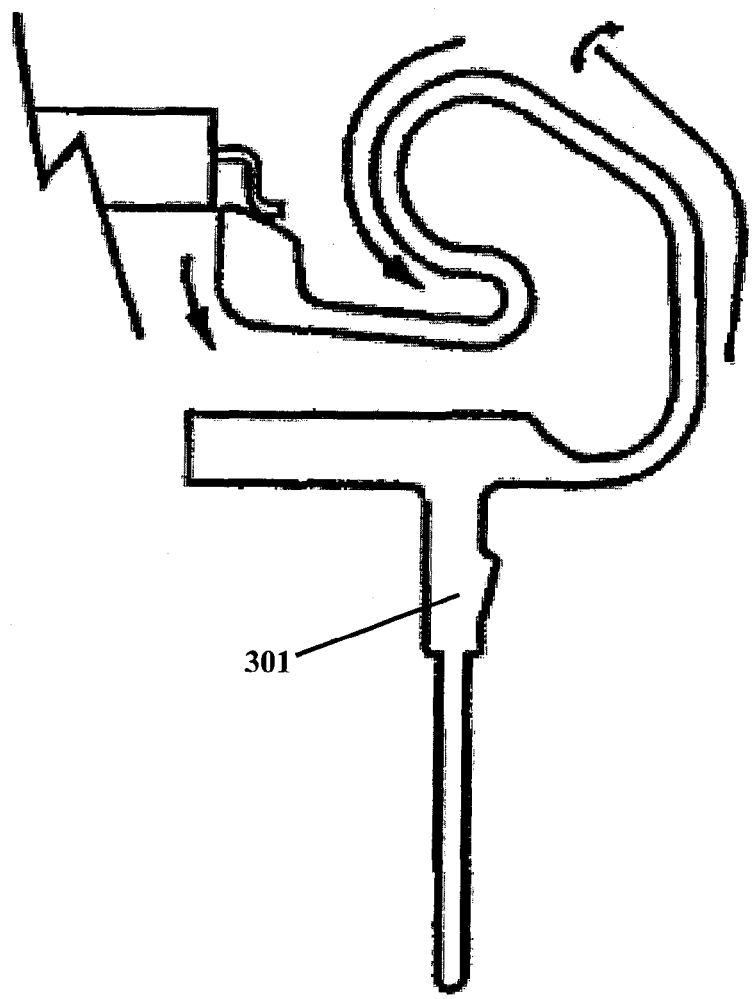
FIG. 3 illustrates a known hybrid non-abrasive electrical test contact element of another test socket.

Similar to the U.S. Pat. No. "7,256,958" as shown in FIG. 3, the middle portion of the contact element 401 has multiple loops that allows the pin contact edge 402 of the contact element 401 to, spring downwards or sideways in a rocking and non-sliding motion.

The contact elements 401 may be customized accordingly to a variety of needs. Such needs includes, but are not limited to the following, widening the diameter of the contact element 401; differential pin contact edge 402 height between a pair of the contact elements 401; and increased or decreased spring force of the contact elements 401.

Additionally, the plurality of contact elements 401 attenuates towards the pin contact edge 402. There is a protruding tooth 412 beneath the molded socket 405 that restricts the contact element 401 from extending above the test socket 400. When the contact elements 401 are not being pressed, the protruding tooth 412 serves as a stopper that limits the movements of the contact element 401. The molded socket 405 is molded in such a manner that limits the contact elements 401 to extend over the molded socket 405 at a specific height. When the contact elements 401 are being pressed downwardly from the tips, the space between each contact element 401 and the molded socket 405 increases, hence eases the movement of the contact elements 401.

In FIG. 1, the contact elements 102 are vertically straight towards the contact tip 101. Relatively higher costs are incurred in manufacturing the test socket 100 for tight tolerance and/or precision, in holding the contact elements firmly in position. In contrast, the protruding tooth 412 beneath the molded socket 405 and the attenuated portion of the contact elements 401 reduces the overall cost of manufacturing the test socket 400. Further, the attenuated portion prevents residue (e.g. plating peel-off from the DUT's lead) from trapping between the pair of contact elements 401.

In one embodiment of the present invention, the ball bearings 417 rotates about freely within the side of the opening 419 of the socket cap 418. The ball bearings 417 prevents wear and tear surrounding the socket cap 418 by reducing friction between the DUT and the socket cap 418 during IC testing.

In another embodiment of the present invention, the floating nest 404 is similar to an ejecting lid during an automatic, manual or high-speed IC testing. The floating nest 404 aligns both the contact elements 401 and the DUT's lead against the pin contact edge 402 together, and also pushes the DUT out after the IC testing. The alignment of the contact elements 401 and the DUT together provides a more accurate contact and time efficient IC testing. The floating nest 404 also prevents the DUT from catching onto the pair of pin contact edge 402 or damaging the DUT during the IC testing.

Further, the stand-off pins 416 on the surface of the floating nest 404 supports the DUT during the IC testing. The stand-off pins 416 maintain a gap or height between the floating nest 404 and the base of the DUT. The gap is for any residues such as mold flash, dust, etc. that precipitates at the base of the floating nest 404. The gap also maintains planarity of the DUT.

The plurality of springs 403 supports the floating nest 404 on top of the molded socket 405, assisting the movement of the floating nest 404 when the DUT is placed onto or removed from the floating nest 404.

In another embodiment of the present invention, the through-apertures 413 disposed on the surface of the molded socket 405 allows the plurality of contact elements 401 to be aligned closely together yet prevents contact between at least the pair of the contact elements 401 and prevents shorting of the contact elements 401.

Further, if the contact elements 401 are over-compressed, the pin contact edge 402 grinds against the through-apertures 413 of the molded socket 405 and causes the molded socket 405 to wear or chip off. This leaves a mark on the molded socket 405 which may serve as an indication of over-compression on the contact elements 401. Issues or problems arising from over-compression may include breakage in the contact elements 401; distortion of the contact elements 401 leading to low yield; and reduction in the spring force of the contact elements 401. Reduction in the spring force of the contact elements 401 hinders its overall movement and the pin contact edge 402 may not be pushed out of the molded socket 405. Therefore, the pin contact edge 402 may not be electrically connected to the DUT during IC testing, resulting in an open-circuit. Depending on the design required, the tip of each contact element 401 may be profiled with sharp edge or the like or any similar marking means for creating marking or indications when over-compression occurs.

Additionally, the base of the molded socket 405 has a stopper 414 that may be customized according to the contact elements 401 used for the test socket 400. The stopper 414 prevents the contact elements 401 from over-extending out of the molded socket 405, or to push each pair of contact elements 401 towards each other and against the through-apertures 413 in the molded socket 405.

In another embodiment of the present invention, the air vent 415 in the test socket 400 is provided to force dust or any other known residue out of the floating nest 404. The air vents 415 are located on each side of the molded socket 405. The air vents 415 also assist in cooling down the pin contact edge 402 and subsequently the whole contact element 401, as friction between the DUT and the pin contact edge 402 may cause high temperatures during high speed IC testing. Cooling the contact elements 401 allows high-current IC testing, and also prevents oxidation to occur on the pin contact edge 402. Oxidation may cause high contact resistance during IC testing.

Figure 4B:
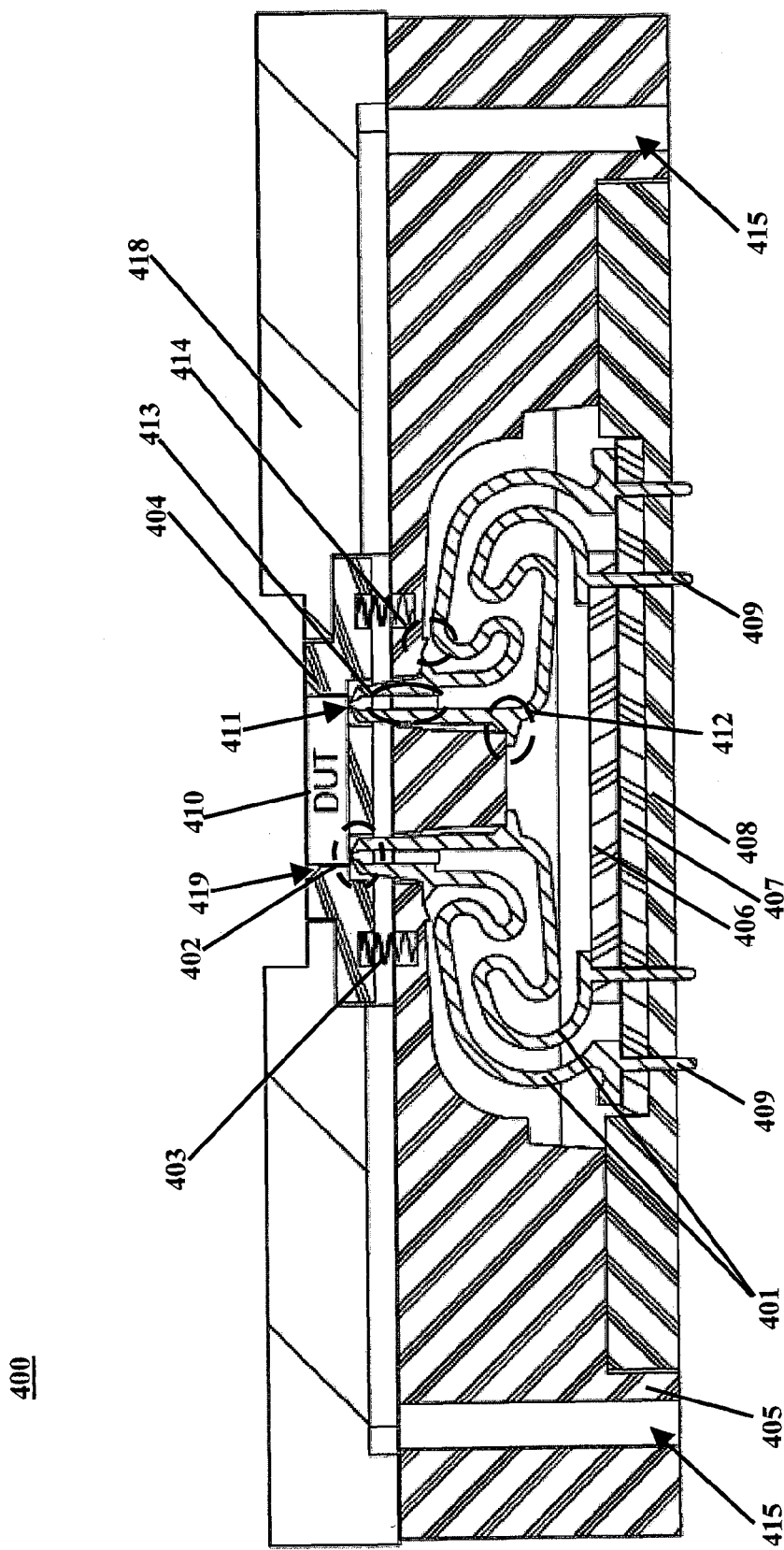
FIG. 4B illustrates a cross-sectional view of a test socket with a Device Under Test (DUT) in place.

FIG. 4B illustrates a cross-sectional view of the test socket 400 with a Device Under Test 410 in place as another embodiment of the present invention. The DUT 410 has a number of leads 411.

During an IC testing, the DUT 410 is placed within the opening 419 of the socket cap 418 and onto the surface of the floating nest 404. The stand-off pins 416 on the floating nest 404 supports the DUT 410. The DUT's leads 411 remains contactable with the pin contact edge 402.

Figure 4C:
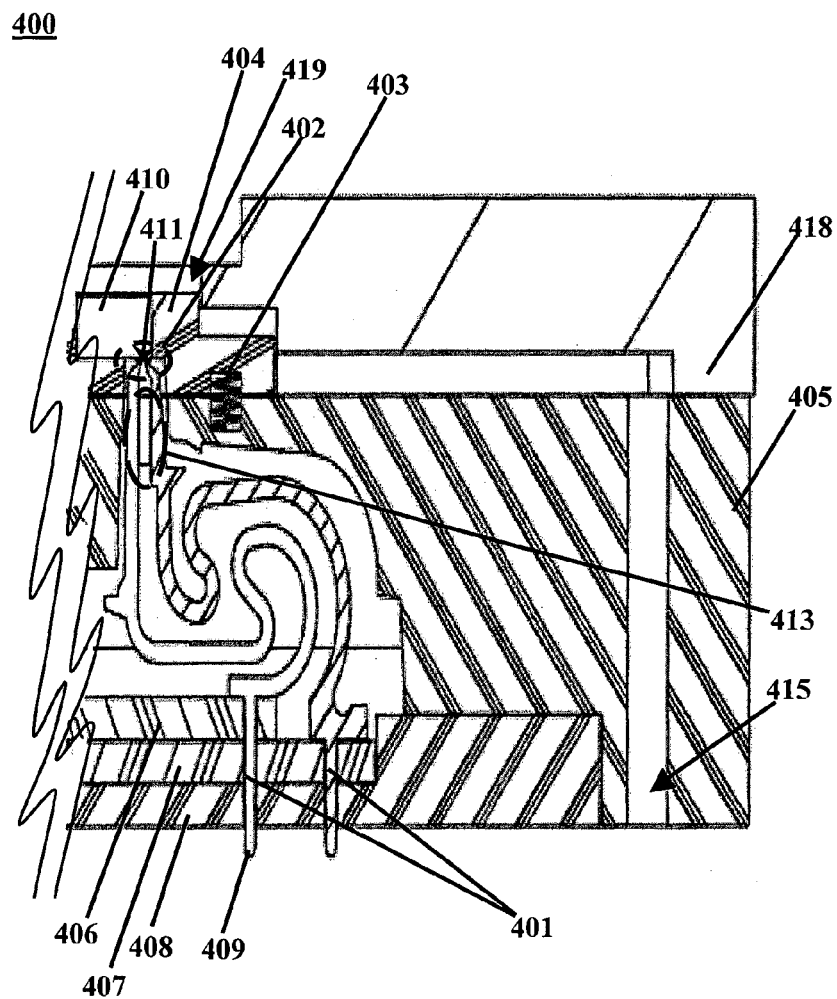
FIG. 4C illustrates a portion of the test socket.

FIG. 4C illustrates a portion of the test socket 400. During IC testing, the DUT 410 is placed onto the test socket 400 and pushes downwards simultaneously with the floating nest 404, compressing the spring 403. The floating nest 404 remains in close contact with the molded socket 405 and the pin contact edge 402 remains at a distance away from the molded socket 405. When over-compression occurs, the floating nest 404 pushes downwards further and the pin contact edge 402 grinds against the through-apertures 413 in the molded socket 405.

Figure 5:
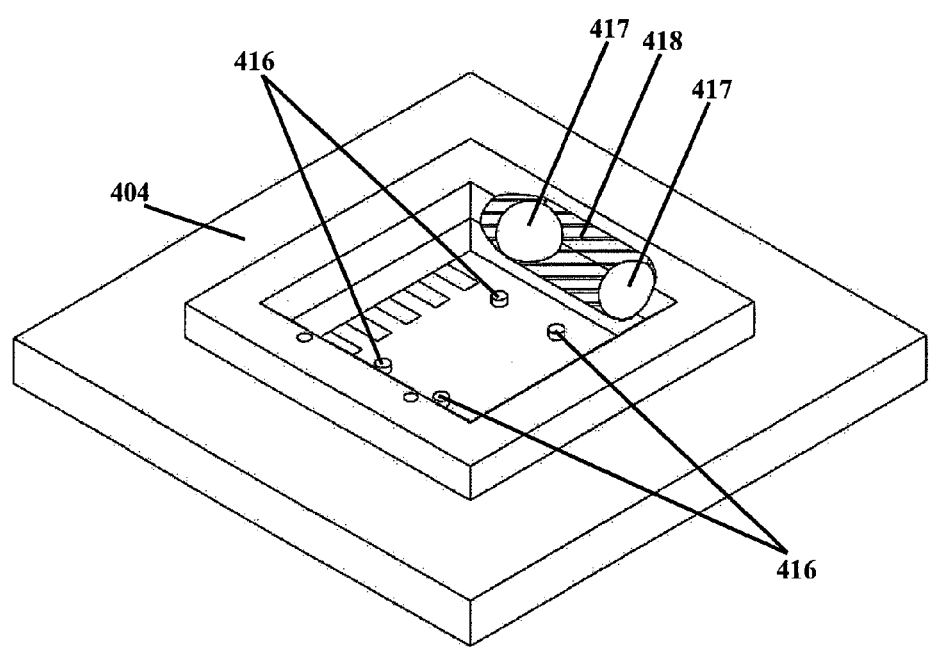
FIG. 5 illustrates a line drawing of the floating nest as another embodiment of the present invention.

FIG. 5 illustrates a line drawing of the floating nest 404 as another embodiment of the present invention. The surface of the floating nest 404 includes a number of the stand-off pins 416. Further, the ball bearings 417 that are located within the socket cap 418 are shown surfacing through one side of the floating nest 404.

Figure 6A:
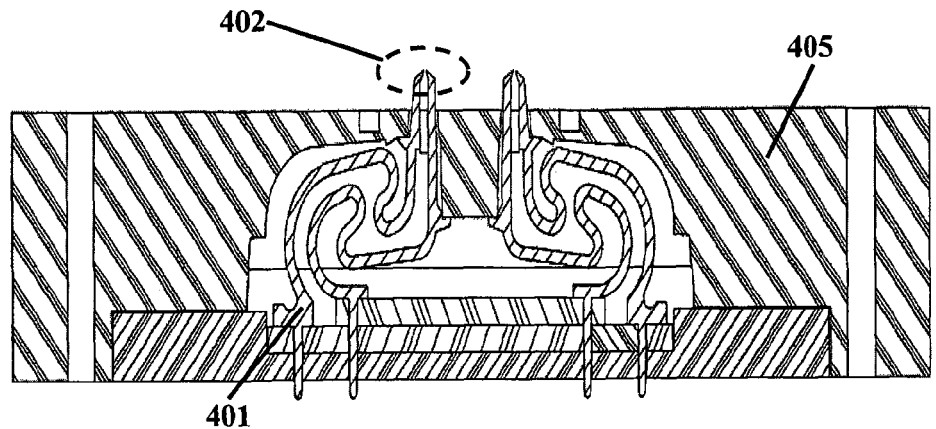
FIGS. 6A-6E exemplifies a variety of designs of the contact element provided for the test socket.
Figure 6B:
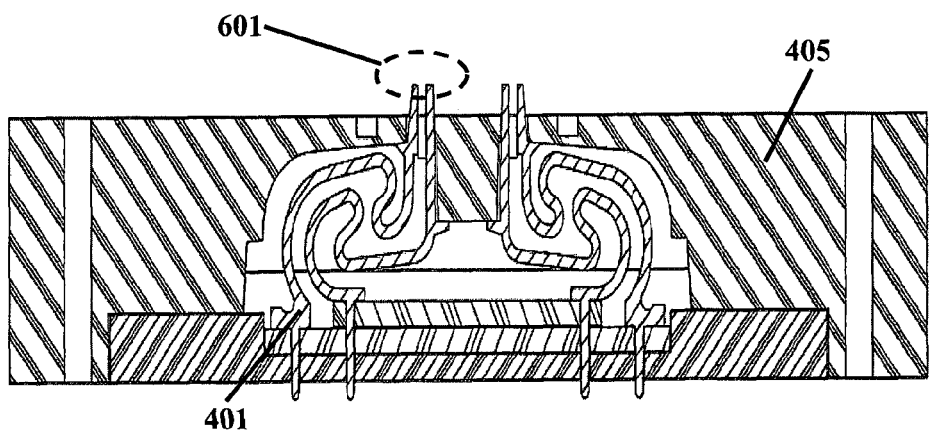
Figure 6C:
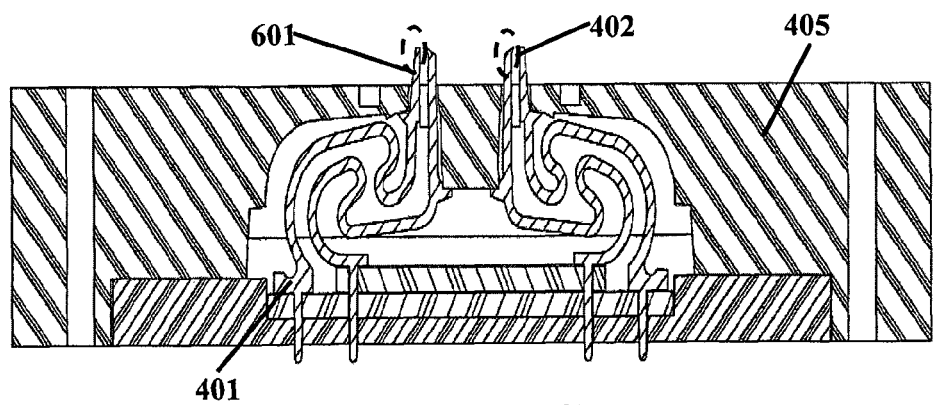
Figure 6D:
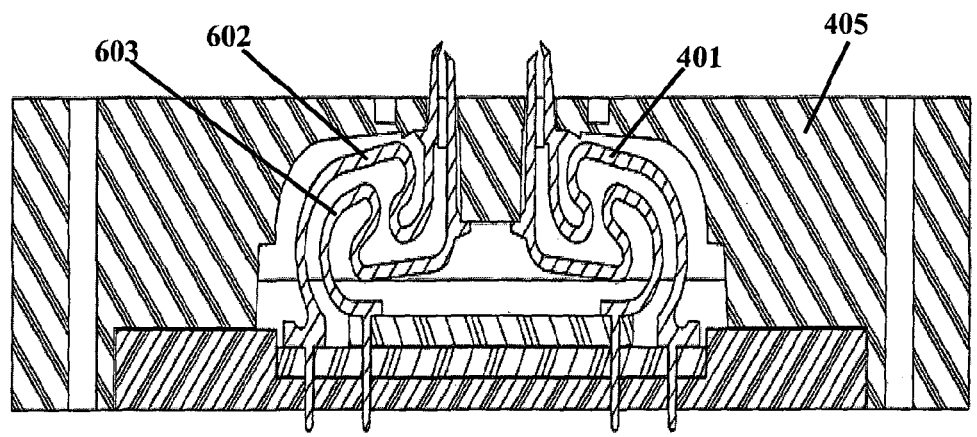
Figure 6E:
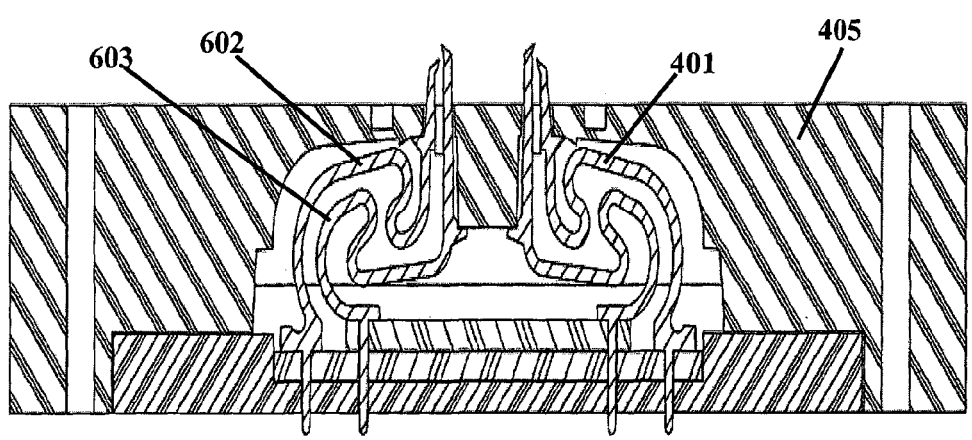

FIGS. 6A-6C exemplifies various types of pin contact edge 402 provided for the contact element 401. FIGS. 6D-6E exemplifies differing heights of the pin contact edge 402 extending out of the molded socket 405.

FIG. 6A shows the same "hook-like" design as illustrated in FIG. 4A. FIG. 6B shows a flat pin contact edge 601 that may be provided for bigger IC testing. FIG. 6C shows both the flat pin contact edge 601 and the "hook-like" design mirroring each other in each pairs of contact elements 401 when aligned together. The flat pin contact edge 601 is typically used for testing IC with a flat surface pad, such as a Quad Flat Package (QFP), etc.

FIG. 6D illustrates a design with an outer 602 contact element 401 and an inner 603 contact element 401 found in a mirror image configuration. The outer 602 contact elements 401 are higher as compared to the inner 603 contact elements 401. In contrast, FIG. 6E illustrates a design with the inner 603 contact elements 401 in a configuration higher than the outer 602 contact elements 401. The differences in the height of the outer 602 contact elements 401 and the inner 603 contact elements 401 prevents solder migration to occur and pile up between the pin contact edge 402. Solder migration may result in an unintended electrical path or short-circuit that may affect the IC testing.

The above description illustrates various embodiments of the present invention along with examples of how aspects of the present invention may be implemented. While specific embodiments have been described and illustrated it is understood that many charges, modifications, variations and combinations thereof could be made to the present invention without departing from the scope of the present invention. The above examples, embodiments, instructions semantics, and drawings should not be deemed to be the only embodiments, and are presented to illustrate the flexibility and advantages of the present invention as defined by the following claims:

The invention claimed is:

1. A test socket adaptable for testing a Device Under Test (DUT) with leads, the test socket comprising:
   a molded socket having an inner space and a plurality of through-apertures disposed on its surface;
   a floating nest supported by a plurality of springs on top of the molded socket, wherein the DUT is placed onto the floating nest during test;
   a socket cap with an opening in the center of the socket cap, wherein the socket cap is adapted for capping above the molded socket for holding the floating nest in place; and
   a plurality of contact elements disposed within the inner space of the molded socket, each contact element has a pin contact edge and a pin-end,
   wherein each pin contact edge extends through the through-apertures of the molded socket for contacting with the DUT during test;
   wherein each pin contact edge defines a linear surface area for contacting with the DUT's lead; and
   wherein each pin contact edge provides a large contact area relative to contact top for various DUT's lead size.

2. The test socket according to claim 1, wherein the contact elements are aligned together in pairs in consecutive rows, each pair positioned to contact a corresponding DUT's lead.

3. The test socket according to claim 2, wherein each pair of the contact elements are in a mirror image configuration.

4. The test socket according to claim 1, wherein the pin contact edge is alike a sharp arrow angled at least 45° diagonally upwards.

5. The test socket according to claim 1, wherein the floating nest further includes a number of stand-off pins on the surface of the floating nest.

6. The test socket according to claim 1, wherein the socket cap further includes a plurality of ball bearings partially embedded in one side of the opening.

7. The test socket according to claim 1, wherein each contact element has a protruding tooth disposed beneath the molded socket for restricting the contact element to extend over the molded socket at a specific height.

8. The test socket according to claim 1, wherein the middle portion of each contact element has multiple loops that allows the pin contact edge of the contract element to spring downwards or sideways in a rocking and non-sliding motion.

9. The test socket according to claim 1, wherein each through aperture is adapted for one pin contact edge to extend through thereby prevents contact between the contact elements.

* * * * *